METHOD OF MANUFACTURE OF HIGH VOLTAGE SOLAR CELL

Filed June 21, 1965

INVENTOR.
JOHN M. GAULT

BY

OSTROLENK, FABER, GERB & SOFFEN
ATTORNEYS

3,422,527
METHOD OF MANUFACTURE OF HIGH VOLTAGE SOLAR CELL

John M. Gault, Manhattan Beach, Calif., assignor to International Rectifier Corporation, El Segundo, Calif., a corporation of California Filed June 21, 1965, Ser. No. 465,542
U.S. Cl. 29—572 1 Claim
Int. Cl. H01g 9/20; H01l 15/02; H01l 5/00

ABSTRACT OF THE DISCLOSURE

A high voltage output solar cell is formed by stacking at least 100 wafers, each of which contains a junction and each of which has a thickness of about 0.004 inch, and soldering the wafers together with the P-N junctions therein having the same direction. The assembled stack is then longitudinally sliced to form a plurality of slabs having leads connected to the ends thereof, with each slab having a transverse thickness of about 0.12 inch.

This invention relates to a novel method of manufacture for high voltage solar cells, and more specifically relates to the method of manufacture for a high voltage output photogenerating cell having a relatively low current output which is composed of the direct series connection of a large number of individual photogenerating cells assembled into a stack.

As is well known, photogenerating cells of silicon, commonly known as solar cells, consist of a single large area junction in a wafer monocrystalline material such as silicon. These individual cells will generate from 0.3 to 0.6 volt, and in order to obtain higher output voltages, many cells must be connected in series.

Where large output current of the order of 70 milliamperes or more are required, this direct series connection of individual cells provides an adequate device. There are, however, many applications where a particular electrical circuit requires relatively high voltages where, however, lower currents than 70 milliamperes are adequate.

The principle of the present invention is to pre-form a large number of individual solar cells, and thereafter stack these cells with interposed solder wafers or the like, for securing the individual wafers together face to face with the forward and blocking directions of each of the cells being oriented in the same direction. These cells are then placed into a suitable soldering furnace, and the temperature increased so that the complete assemblage is soldered together. Thereafter, and in accordance with the invention, the assemblage is sliced into thin parallel slabs which are perpendicular to the flat surfaces of the wafers so that each of the slabs is composed of sections of the series connected wafers. Thereafter, these slabs are appropriately etched to remove saw damage from the sliced surfaces, and to remove shorted areas from the ends.

Thus, the resulting cell will define a large number of series connected junctions, the edges of the junctions being exposable to incident radiation.

In a typical example, 164 junctions can be connected in series with the sliced slabs being approximately 1 by 2 centimeters in dimension with the entire cell producing approximately 66 volts at 100 microamperes in average sunlight.

Accordingly, a primary object of this invention is to provide a novel method for the manufacture of a high voltage photogenerating cell.

Another object of this invention is to form a novel high voltage solar cell which is comprised of a large number of series connected junctions, the edges of which are exposed to incident radiation.

These and other objects of this invention will become apparent from the following description when taken in connection with the drawings, in which.

Figure 1:
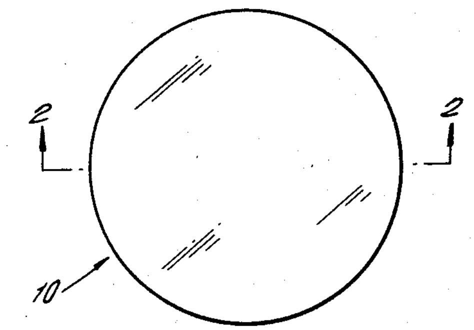
FIGURE 1 is a top view of a typical wafer or individual solar cell which is preformed to be assembled in a stack in accordance with the invention.
Figure 2:
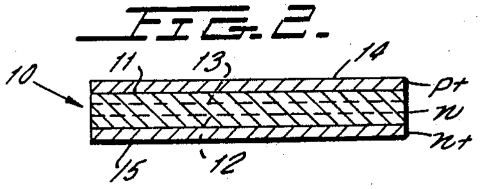
FIGURE 2 is a cross-sectional view of FIGURE 1 taken across the line 2—2 in FIGURE 1.

Referring first to FIGURES 1 and 2, I have illustrated therein a typical individual solar cell which is to be assembled into a stack in accordance with the method of the invention. Thus, in FIGURES 1 and 2, the individual cell 10 is formed of a large area wafer of semiconductor material such as silicon which has a thickness of the order of 0.01 cm., and a diameter of the order of 3 cms. Note that square wafers could also be used.

The wafer of FIGURES 1 and 2 is formed to have photogenerating characteristics by any standard well known manner, and can, for example, be comprised of a normally N-type material which has an upper P+ region 11 and a lower N+ region 12 diffused therein. The active junction 13 is then defined between the P+ and N regions, while the N+ region forms an area which will readily accept an intimately bound electrode.

Thereafter, the wafer is nickel-plated on both its surfaces, sintered and then renickel-plated in the standard and well-known manner (for the case of the rear surface only in the prior art), thereby to define conductive electrodes 14 and 15 on the upper and lower surfaces of the silicon wafer.

Figure 3:
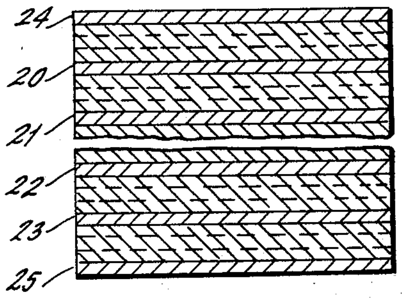
FIGURE 3 is a cross-sectional view of a completely assembled stack which has been assembled with interposed soldering wafers between the stack of wafers of the type shown in FIGURES 1 and 2.

Thereafter, and as shown in FIGURE 3, a large number of wafers of the type shown in FIGURES 1 and 2, such as 164 of these wafers, are assembled into a stack with interposed soldering wafers such as the pure tin wafers 20, 21, 22 and 23, shown in FIGURE 3, with the end terminal wafers 24 and 25 on the opposite ends of the stack.

In FIGURE 3, it will be noted that the electrodes 14 and 15 of each of the wafers of FIGURES 1 and 2 have been eliminated for purposes of clarity. The individual solder wafers such as wafers 20 through 23 may be approximately 0.001 inch in thickness.

Thereafter, the assemblage is placed in a furnace which is brought to a suitable temperature to cause soldering of the complete assemblage wherein the interposed solder wafers are soldered to the opposing nickel-plated electrode surfaces of the adjacent wafers.

Figure 4:
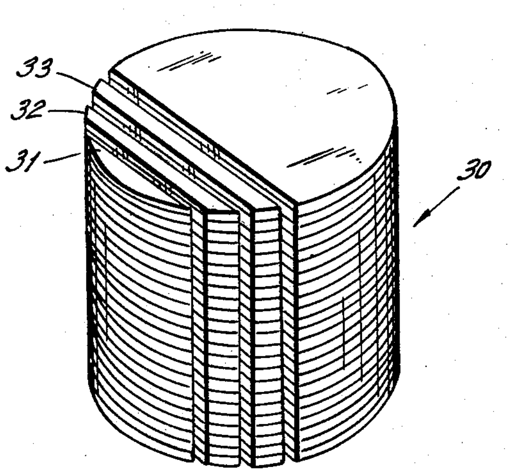
FIGURE 4 is a perspective view of the stack of FIGURE 3 with a few perpendicular slices made through the stack to form the high voltage cell of the invention.

In the next step, and as best shown in FIGURE 4, the assembled stack shown as the assembled stack 30, which is formed of the intimately bound silicon wafers and interposed solder wafers, is sliced into a plurality of parallel slabs which are perpendicular to the plane of the individual wafers. Thus, in FIGURE 4, three such slabs 31, 32 and 33 have been cut from the body 30. Clearly, the entire body 30 will be sliced in this manner.

This slicing operation is performed with a normal diamond cutting wheel commonly used for slicing wafers from an ingot of semiconductor material with techniques well known to those skilled in the art.

Each of the slabs will have a thickness of the order of 0.014 inch. With the example given in the invention, the total width of the slab will be approximately 1 cm., which corresponds to the height of the stack of FIGURE 3, while the length of the slab will depend upon the section from which the cut is made and will be 3 cms. long for the slab taken from the full diameter of the stack 30.

Clearly, if square wafers were used instead of the circular wafers shown in FIGURE 1, each of the slabs would have the identical dimension.

Thereafter, the slabs are immersed in a suitable etching medium to remove saw damage from the surfaces of the slabs and to remove shorted areas from the ends of the slabs. Thus, the slabs are etched to a thickness of approximately 0.012 inch. During this etching process, the outer surfaces of the end wafer sections, which come from solder wafers 24 and 25, are masked to protect these end metal contacts.

Figure 5:
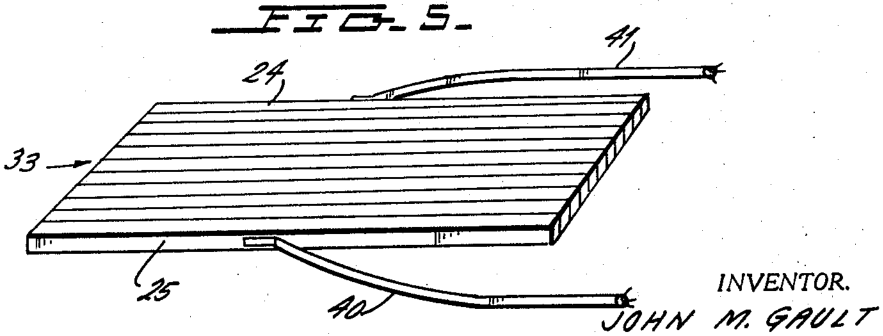
FIGURE 5 is a perspective view of one of the slabs of FIGURE 4 which defines a solar cell in accordance with the invention.

Thereafter, and as shown in FIGURE 5, the individual slab such as slab 33, which may have a length of the order of 2 cms., has lead wires 40 and 41 attached to wafer sections 25 and 24, respectively, thereby to define a completed cell. The entire cell may then be immersed in any suitable protective layer in any desired manner.

The cell of FIGURE 5 will then be a device wherein the individual junctions of the wafer sections are exposed on the surface of the slab. Thus, each individual junction will generate approximately 0.4 volt at 100 microamperes in sunlight. The entire cell then produces approximately 66 volts at 100 microamperes under the same illumination conditions.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. The method of manufacture of a high voltage solar cell comprising the steps of forming at least 100 identical flat wafers of silicon each having a thickness of approximately 0.004 inch with a P-N junction lying in the plane of the wafer, nickel-plating the opposing surfaces of each of said wafers, soldering said wafers in full surface-to-surface contact to form a wafer stack with the blocking directions of each of said wafers in the same direction, slicing said stack into a plurality of slabs having a thickness of approximately 0.012 inch by cutting it along parallel planes extending generally perpendicular to the plane of said wafers, etching the cut surfaces of said slabs until short circuits inadvertently produced by the cutting operation are eliminated, and connecting first and second lead connections to the opposite stack ends of each of said slabs.

References Cited

UNITED STATES PATENTS

| | | | |
|---|---|---|---|
| 2,588,254 | 3/1952 | Lark-Horovitz | 29—572 X |
| 2,793,420 | 5/1957 | Johnston | 29—590 |
| 2,938,938 | 5/1960 | Dickson | 29—572 X |
| 3,235,428 | 2/1966 | Naymik | 29—577 X |
| 3,274,454 | 9/1966 | Haberecht | 317—234 |

WILLIAM I. BROOKS, *Primary Examiner.*

U.S. Cl. X.R.

29—580, 583; 136—89; 317—234